United States Patent [19]
Sander

[11] Patent Number: 6,140,882
[45] Date of Patent: *Oct. 31, 2000

[54] PHASE LOCK LOOP ENABLING SMOOTH LOOP BANDWIDTH SWITCHING

[75] Inventor: Brian Sander, San Jose, Calif.

[73] Assignee: Tropian, Inc., Cupertino, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/197,523

[22] Filed: Nov. 23, 1998

[51] Int. Cl.[7] ................................... H03L 7/00
[52] U.S. Cl. ................. 331/25; 331/105; 331/108
[58] Field of Search .............. 331/25, 105, 108; 327/105, 108

[56] References Cited

U.S. PATENT DOCUMENTS

| 5,317,480 | 5/1994 | Hedberg et al. | 331/16 |
| 5,420,545 | 5/1995 | Davis et al. | 331/17 |

*Primary Examiner*—Robert Pascal
*Assistant Examiner*—Kimberly E Glenn

[57] ABSTRACT

The present invention, generally speaking, provides a PLL that enables smooth switching of loop bandwidth without changing the loop filter. In accordance with one aspect of the invention, the loop bandwidth of a phase lock loop including an output frequency divider and a reference frequency divider is changed by changing a divisor of the output frequency divider by a factor and changing a divisor of the reference frequency divider by substantially the same factor. If the factor is greater than one, the loop bandwidth is decreased. If the factor is less than one, then the loop bandwidth is increased. In accordance with another aspect of the invention, a phase lock loop includes an oscillator having a control input, a phase comparator, a loop filter, and a feedback path including an output frequency divider. A reference frequency divider is also provided. A controller is coupled to the output frequency divider and to the reference frequency divider for changing a divisor of each at substantially the same time in response to a bandwidth select signal. The controller changes the divisors by substantially the same factor, changing the loop bandwidth without affecting the output frequency of the phase lock loop.

7 Claims, 3 Drawing Sheets

PHASE LOCK LOOP ENABLING SMOOTH LOOP BANDWIDTH SWITCHING

BACKGROUND OF THE INVENTION

1. Field of the Invention

The present invention relates to phase lock loops, more particularly to phase lock loops having both a wide-band mode and a narrow-band mode of operation.

2. State of the Art

Practically all modem signal generators and radio communications equipment use digital frequency synthesizers based on the phase locked loop (PLL). The realization of the PLL in an integrated circuit has led to the widespread adoption of inexpensive frequency synthesizers. In its application of frequency synthesis (as opposed to signal detection), the input signal-to-noise ratio of the PLL is high, and the PLL serves to lock the output frequency on a multiple of the input frequency.

A PLL consists generally of three parts: a reference frequency input portion, a loop filter portion, and a voltage-controlled oscillator (VCO) portion. The reference frequency portion includes a phase comparator and may include a frequency divider (which may be programmable). The phase comparator compares an output signal of the PLL with the reference frequency itself or the reference frequency divided down, thereby producing an error signal. The loop filter filters the error signal to produce a control signal that is applied to the VCO. During proper operation, the control signal drives the VCO in the proper direction so as to cause the error signal to be driven to zero or nearly zero.

PLLs generally operate in two different modes: acquisition during which the PLL locks onto a particular frequency, and tracking, during which the PLL ensures that it remains locked. Both fast acquisition and accurate tracking in the presence of modulation are important design objectives. Unfortunately, these design objectives are, in general, conflicting. For fast acquisition, a wide loop bandwidth is desired. For accurate tracking, in the presence of modulation, a narrow loop bandwidth is desired. In cellular applications, for example, when changing channels, a wide loop bandwidth is desired to accomplish the frequency change as quickly as possible. When operating on a single channel, voice data having low frequency content is modulated onto a carrier signal. The PLL attempts in effect to cancel the modulation, which appears to the PLL as frequency drift. To accomplish slow modulation, therefore, a very narrow loop bandwidth is desired, such that the modulation is accomplished outside the PLL bandwidth.

One proposal has been to, in narrowband mode, open the loop entirely during short modulation bursts and to close the loop when modulation is not applied. This approach assumes that, if the loop is opened for only short periods at a time, the drift that may occur during open-loop operation will not be substantial. This solution may be acceptable under certain limited conditions but is not generally applicable.

Referring more particularly to FIG. 1, a portion of a PLL is shown, including the loop filter and the VCO. The loop filter includes a charge pump having a first "pump-up" current source connected to inject current into circuit node A, and a second "pump-down" current source connected to withdraws current from the same node. The pump-up current source is connected to a positive supply voltage V+, and the pump-down current source is connected to a negative supply voltage V−. Besides the charge pump, there is also connected to node A a loop filter, typically realized by a capacitor connected to ground and the series combination of a resistor and capacitor, connected to ground. A tuning voltage VT is produced at node A and is input to the VCO to control the rate of oscillation of the VCO.

The loop bandwidth of the circuit of FIG. 1 may be changed by changing the values of one or both of the capacitors, such that they charge more slowly or more quickly. Changing the values of the capacitors usually requires some form of switching. However, it is also important not to disturb the voltage on the capacitors. Switching usually introduces undesirable transients, since it is well-known that to change a capacitor value at a fixed voltage requires an instantaneous change in the stored charge. A preferable way of changing the loop bandwidth then is to vary the magnitude of the currents supplied by the current sources. To switch from wide to narrow bandwidth, for example, instead of switching in additional capacitors to make the capacitance larger, the current gain would be altered to make the currents smaller.

U.S. Pat. No. 5,675,292 describes a PLL that enables smooth switching of loop bandwidth over a wide range. By switchably inserting a resistance between the output of a current-mode charge pump and a loop filter of the PLL, current sources of the charge pump are made to appear as voltage sources, and a suitably small trickle current may be obtained for narrowband tracking. During acquisition, the resistance is bypassed, such that the current sources again function as current sources in the PLL for fast loop response. Typically, another switch is required to adjust the dynamic characteristics of the loop filter. Operation is not entirely free of transients.

What is needed, then, is an improved PLL that enables smooth switching of loop bandwidth.

SUMMARY OF THE INVENTION

The present invention, generally speaking, provides a PLL that enables smooth switching of loop bandwidth without changing the loop filter. In accordance with one aspect of the invention, the loop bandwidth of a phase lock loop including an output frequency divider and a reference frequency divider is changed by changing a divisor of the output frequency divider by a factor and changing a divisor of the reference frequency divider by substantially the same factor. If the factor is greater than one, the loop bandwidth is decreased. If the factor is less than one, then the loop bandwidth is increased. In accordance with another aspect of the invention, a phase lock loop includes an oscillator having a control input, a phase comparator, a loop filter, and a feedback path including an output frequency divider. A reference frequency divider is also provided. A controller is coupled to the output frequency divider and to the reference frequency divider for changing a divisor of each at substantially the same time in response to a bandwidth select signal. The controller changes the divisors by substantially the same factor, changing the loop bandwidth without affecting the output frequency of the phase lock loop.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
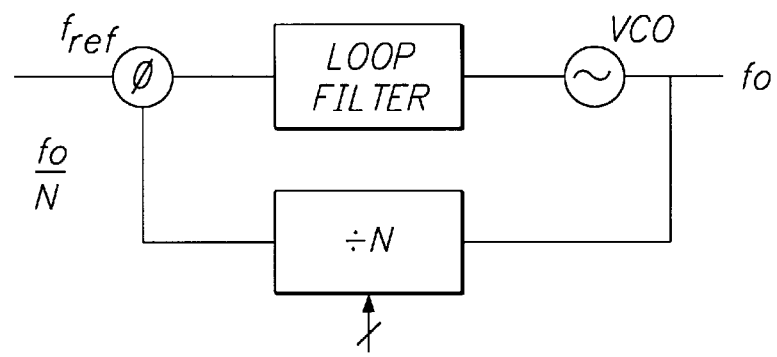
FIG. 1 is a circuit diagram of a portion of a conventional PLL.
Figure 2:
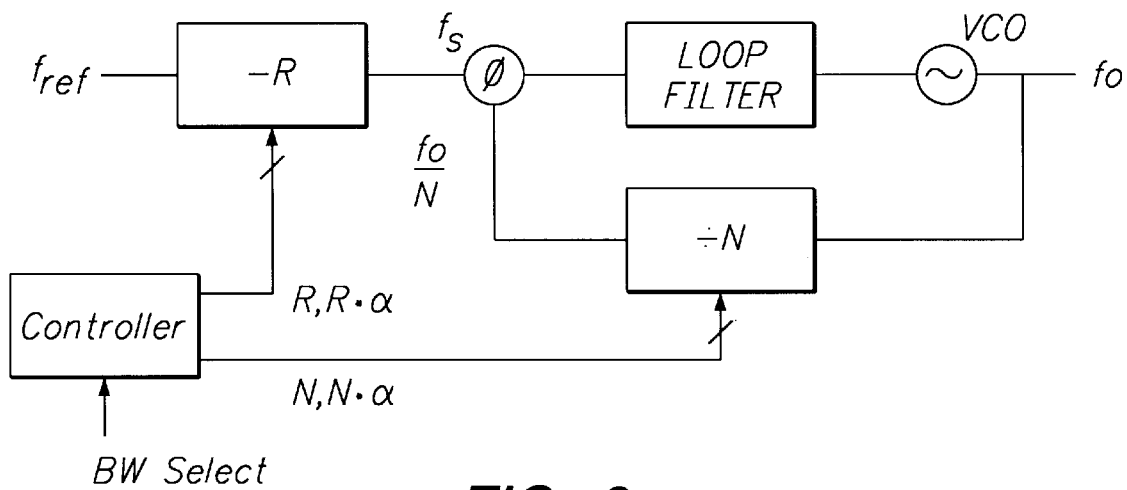
FIG. 2 is a circuit diagram of a PLL in accordance with the present invention.

Referring to FIG. 2, a circuit diagram is shown of a PLL in accordance with one embodiment of the present invention. A first portion of the PLL is largely conventional and includes a phase detector, a loop filter, a VCO, and an output frequency divider. Typically, a reference frequency is input directly to the phase comparator. In the embodiment of FIG. 2, however, a reference frequency divider receives the reference frequency signal $f_{ref}$ and divides the reference frequency by a divisor R to obtain a sample frequency $f_s$, which is input to the phase comparator.

A controller is coupled to the output frequency divider and to the reference frequency divider. The controller receives and bandwidth select signal and responsive thereto applies one of two pairs of divisors, (N, R) or (α N, α R) to the dividers, respectively.

The effect of applying the second of the foregoing two pairs of divisors to the dividers may be appreciated as follows. At lock, $$\frac{f_0}{N} = f_s; f_0 = N f_s$$

By observation, $$f_s = \frac{f_{ref}}{R}$$

Algebraic manipulation produces the following result:

$$f_0 = \frac{N}{R} \cdot f_{ref}$$
$$= K \cdot f_{ref}$$

Note further that $$K = \frac{N}{R}$$
$$= \frac{N}{R} \cdot \frac{\alpha}{\alpha}$$

Figure 3:
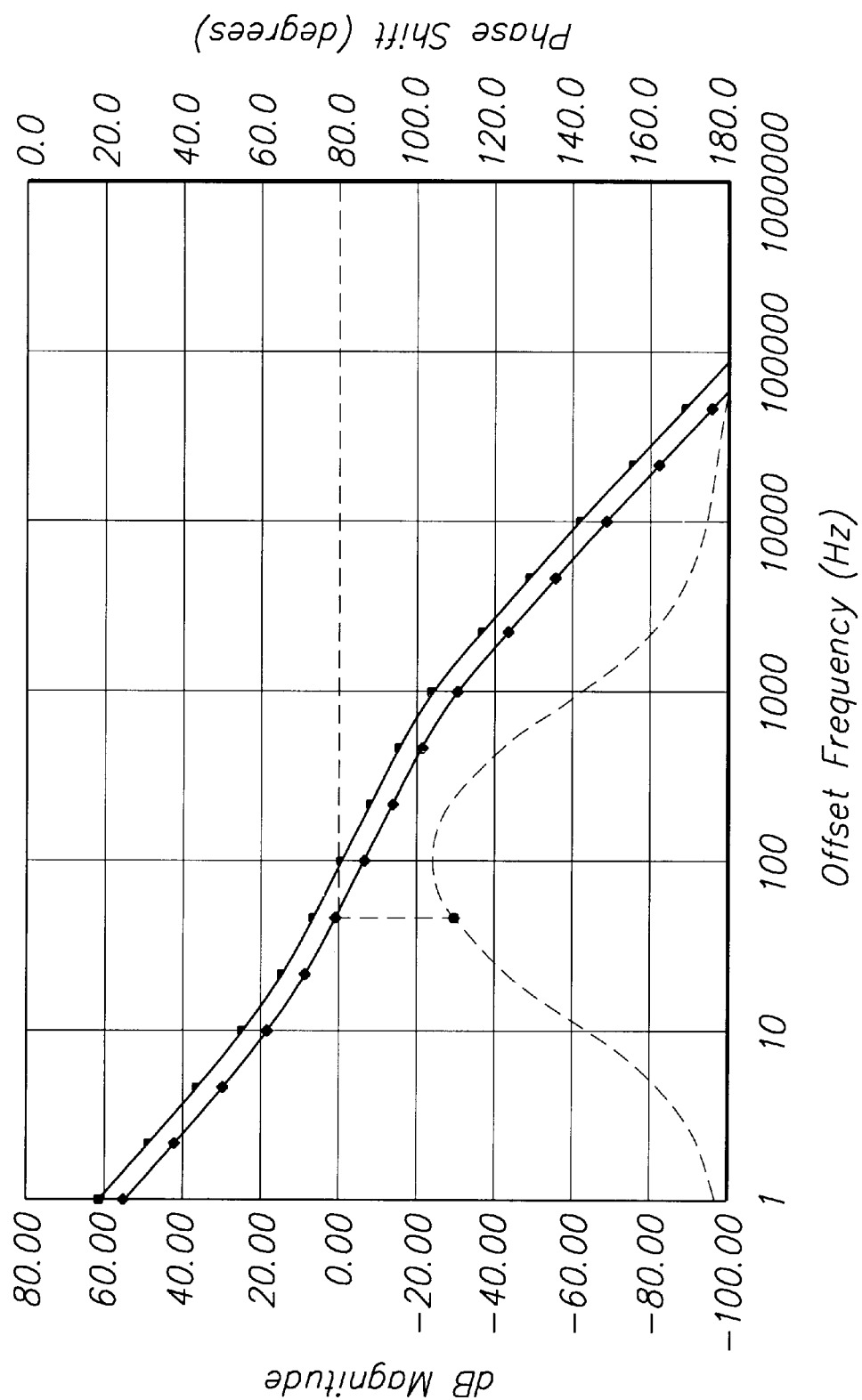
FIG. 3 is a Bode plot for the PLL of FIG. 2 with α>1.
Figure 4:
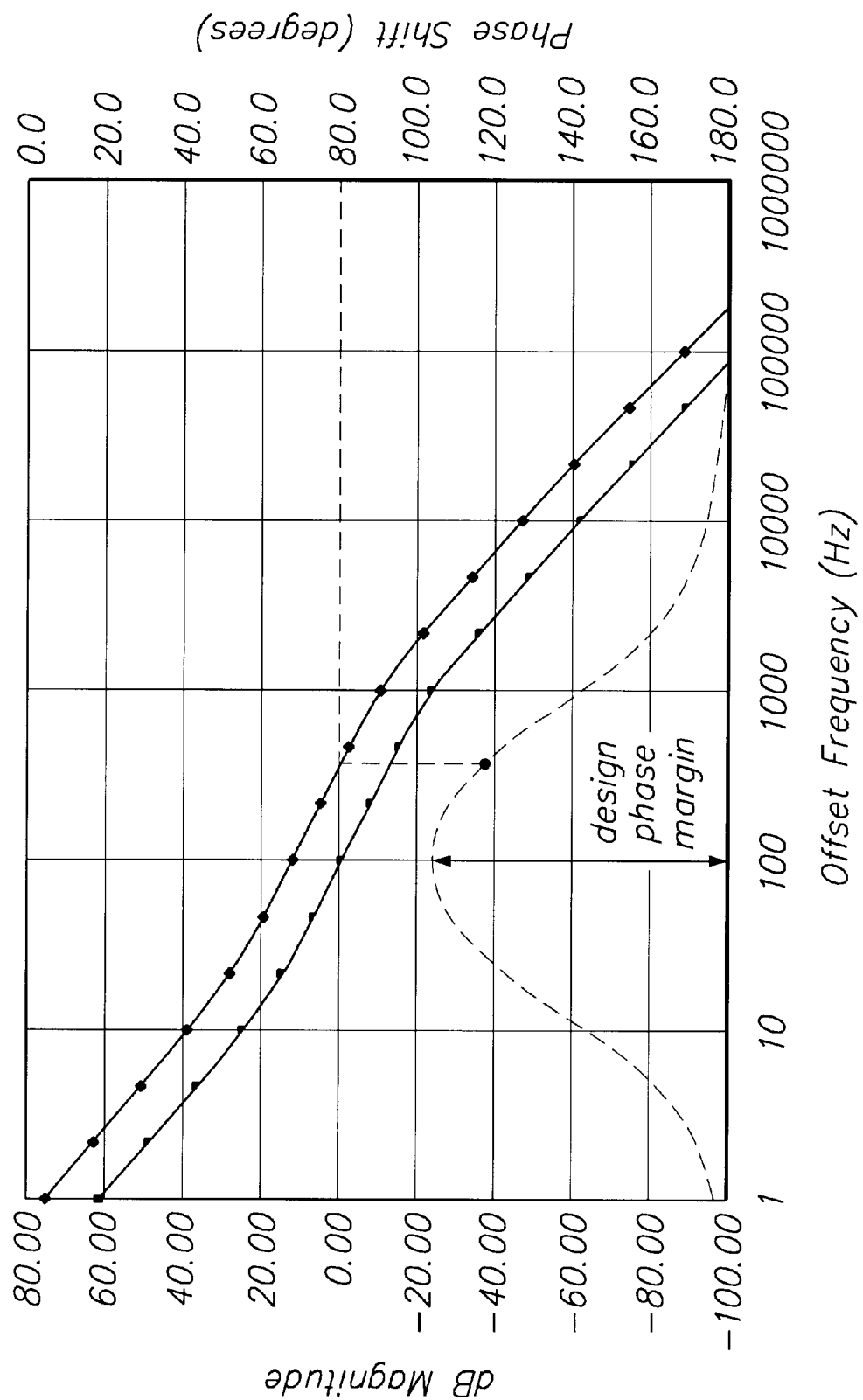
FIG. 4 is a Bode plot for the PLL of FIG. 2 with α<1.

In other words, K is unchanged if multiplied by unity, such that the output frequency remains unchanged regardless of which pair of divisors is applied to the dividers. The loop bandwidth, however, is changed, as may be appreciated from the Bode plots of FIG. 3 and FIG. 4. FIG. 3 is a Bode plot for the case α>1. As seen therein, with α>1, the effect of changing from the first pair of divisors to the second pair of divisors is to shift the amplitude response downward. The 0dB crossing, which defines the loop bandwidth, therefore shifts toward the left (the loop bandwidth is decreased). Phase stability is affected somewhat but not a great deal. FIG. 4 is a Bode plot for the case α<1. As seen therein, with α<1, the effect of changing from the first pair of divisors to the second pair of divisors is to shift the amplitude response upward. The 0dB crossing, which defines the loop bandwidth, therefore shifts toward the right (the loop bandwidth is increased). Again, phase stability is affected somewhat but not a great deal.

In particular, note in FIG. 3 and FIG. 4 that, in the frequency offset range of about 20 to 200 Hz (on tile logarithmic scale of FIG. 3 and FIG. 4, from halfway between 10 and 100 Hz to halfway between 100 and 1000 Hz)—a frequency offset ratio of 10:1—the phase margin is greater than 50° and in fact greater than 60° (180°–120°). The peak phase margin, at 100 Hz, is substantially greater.

Figure 5:
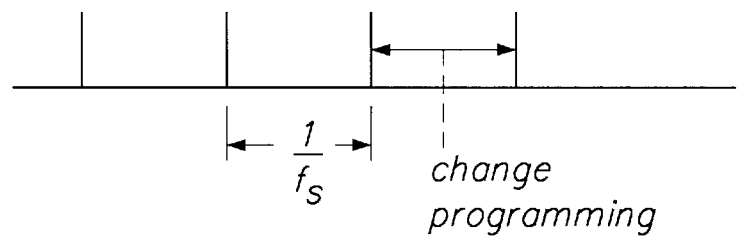
FIG. 5 is a timing diagram illustrating operation of the PLL of FIG. 2.

Referring to FIG. 5, a timing diagram is shown illustrating operation of the PLL of FIG. 2. Regularly occurring output pulses have a periodicity of $1/f_s$. Between output pulses, the divisors may be changed at any time in order to change the loop bandwidth. The output frequency is unaffected.

The present technique is simple in implementation and results in a very smooth change of loop bandwidth. No adjustments in the actual loop filter itself are required. The present technique may, however, be used in conjunction with other techniques for changing loop bandwidth, for example the technique of U.S. Pat. No. 5,675,292, referenced previously.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of changing the loop bandwidth of a phase lock loop including an output frequency divider and a reference frequency divider, comprising:

designing the phase lock loop such that a phase margin of greater than 50° exists throughout at least a 10:1 frequency offset range;

changing a divisor of the output frequency divider by a factor α; and changing a divisor of the reference frequency divider by substantially the same factor;

whereby a smooth change is effected in the loop bandwidth in a single step without substantially impairing phase margin of the phase lock loop.

2. The method of claim 1, wherein α is greater than one, decreasing the loop bandwidth.

3. The method of claim 1, wherein α is less than one, increasing the loop bandwidth.

4. A phase lock loop comprising:

an oscillator having a control input;

a phase comparator;

a loop filter coupled to the phase comparator and to the oscillator;

a feedback loop coupled from an output signal of the oscillator to an input signal of the phase comparator, the feedback loop including an output frequency divider; and a reference frequency divider having an input coupled to a reference frequency signal and an output coupled to the phase comparator; and a controller coupled to the output frequency divider and to the reference frequency divider for changing a divisor of the output frequency divider and a divisor of the reference frequency divider at substantially the same time in response to a bandwidth select signal;

wherein the phase lock loop is designed such that a phase margin of greater than 50° exists throughout at least a 10:1 frequency offset range; and wherein changing a divisor of the output frequency divider and a divisor of the reference frequency divider at substantially the same time effects a smooth change in the loop bandwidth in a single step without substantially impairing phase margin of the phase lock loop.

5. The apparatus of claim 4, wherein the controller changes a divisor of the output frequency divider and a divisor of the reference frequency divider by substantially the same factor.

6. The apparatus of claim 5, wherein said factor is greater than one, decreasing the loop bandwidth.

7. The apparatus of claim 5, wherein said factor is less than one, increasing the loop bandwidth.

* * * * *